United States Patent [19]

Otsuki et al.

[11] 4,232,923

[45] Nov. 11, 1980

[54] ELECTRICAL CONNECTOR

[75] Inventors: Tomonari Otsuki, Tokyo; Hiromasa Inouye, Musashino, both of Japan

[73] Assignee: Bunker Ramo Corporation, Oak Brook, Ill.

[21] Appl. No.: 23,988

[22] Filed: Mar. 26, 1979

Related U.S. Application Data

[63] Continuation of Ser. No. 845,176, Oct. 25, 1977, abandoned.

[30] Foreign Application Priority Data

Oct. 22, 1976 [JP] Japan ................................ 51-141429

[51] Int. Cl.[3] ............................................... H05K 1/12

[52] U.S. Cl. ............................ 339/17 LC; 339/17 M; 339/217 S; 339/258 P

[58] Field of Search ................. 339/17 R, 17 C, 17 L, 339/17 LC, 17 LM, 17 M, 176 MP, 217 S, 258 R, 258 P, 192 R

[56] References Cited

U.S. PATENT DOCUMENTS

| | | | |
|---|---|---|---|
| 2,944,240 | 7/1960 | Barber | 339/66 M |
| 3,638,033 | 1/1972 | Johnson et al. | 339/17 LM |
| 3,668,604 | 6/1972 | Rossman | 339/17 CF |
| 3,696,323 | 10/1972 | Kinkaid et al. | 339/17 C |
| 3,815,077 | 6/1974 | Anhalt et al. | 339/17 CF |
| 3,883,207 | 5/1975 | Tomkiewicz | 339/17 L |
| 3,884,544 | 5/1975 | Lundergan et al. | 339/198 G |
| 3,951,494 | 4/1976 | Romine | 339/17 L |
| 3,980,376 | 9/1976 | Rosen | 339/176 MP |
| 4,035,046 | 7/1977 | Kloth | 339/176 MP |

*Primary Examiner*—Neil Abrams
*Attorney, Agent, or Firm*—F. M. Arbuckle; J. R. Hoffman

[57] ABSTRACT

An electrical connector for attachment to a printed circuit board which allows stacked printed circuit boards to be positioned closer together than previously possible. The connector comprises a housing, one surface of which is mounted against one side of the printed circuit board, and at least one resilient female contact having a terminal end extending through a passageway in the housing and attached to the printed circuit board. An intermediate portion of the female contact is bent such that the portion is substantially parallel to the printed circuit board. The other end of the terminal is folded over to form a wiping surface for contacting a mating male contact extending from an adjacent printed circuit board. The housing includes an opening adjacent the contacting end of the female contact to allow passage of the male contact through the housing and into engagement with the female contact. The fact that the female contact is substantially parallel to the printed circuit board allows the housing to be much shorter than previous connectors, while still allowing for a sufficiently long contact to provide the necessary resilience.

10 Claims, 17 Drawing Figures

ELECTRICAL CONNECTOR

This is a continuation application of application Ser. No. 845,176, filed Oct. 25, 1977 now abandoned.

BACKGROUND OF THE INVENTION

1. Field of the Invention

The present invention relates to the field of electrical connectors for printed circuit boards, and particularly to multiconductor connectors to be mounted directly on printed circuit boards.

2. Description of the Prior Art

Printed circuit board connectors of the prior art typically include a female connector having a plurality of resilient contacts extending perpendicular to the surface of the printed circuit board. These contacts resiliently engage mating male contact pins which are inserted in a direction parallel to the female contacts and perpendicular to the printed circuit board. As the male contact is inserted in the female connector, the female contacts are forced out of their equilibrium shapes. In order to insure that the female contacts are not permanently deformed by this movement, they must be of a sufficient length to disperse the stresses such that the stresses do not exceed the elastic limit of the contact material at any one point. This requires that the female connectors of the prior art extend a relatively large distance from the surface of the printed circuit board.

Modern miniature electronic components frequently extend a smaller distance from the printed circuit board than do the prior art female connectors. Since it is often desirable to stack printed circuit boards as close together as possible, the prior art connectors place an undesirable limit on how close the boards may be stacked.

Prior attempts to reduce the height of the connectors have resulted in connectors which wear out or become loose after a few uses due to their short contact length.

SUMMARY OF THE INVENTION

It is therefore an object of the present invention to provide an electrical connector for printed circuit boards which allows a closer stacking of adjacent printed circuit boards than hitherto possible.

It is a further object of the present invention to provide a printed circuit board connector which allows closer stacking of printed circuit boards without causing a corresponding degradation in contact resilience.

It is a specific object of the present invention to provide a printed circuit board electrical connector in which the female contacts are substantially parallel to the surface of the printed circuit board, whereby the contacts can be made of any desired resilience without requiring an undesirable spacing between adjacent connected printed circuit boards.

The present invention fulfills the above objects by providing a connector housing having a bottom surface to be mounted on a printed circuit board and at least one female contact having a terminal end extending through the housing to be connected to a circuit path on the circuit board. An intermediate portion of the contact is bent so as to be substantially parallel to the surface of the printed circuit board, and the other end of the contact is folded back to form a wiping contacting end. The housing also includes a male contact receiving opening positioned such that a male contact pin inserted through the opening will be resiliently engaged by the wiping contacting end of the female contact. The intermediate portion of the female contact is preferably bowed to increase its resilience. Since the intermediate portion of the female contact may be of any desired length, any desired resilience may be obtained without increasing the distance which the connector extends from the surface of the printed surface board.

A male connector to be used with the above-described female connector may advantageously be a simple elongated contact of any desired length sized to fit in the contact receiving opening.

BRIEF DESCRIPTION OF THE DRAWINGS

The invention will now be described in detail with reference to the accompanying drawings representing preferred embodiments of printed circuit board connectors according to the present invention.

In the drawings.

DESCRIPTION OF THE PREFERRED EMBODIMENTS

Figure 1:
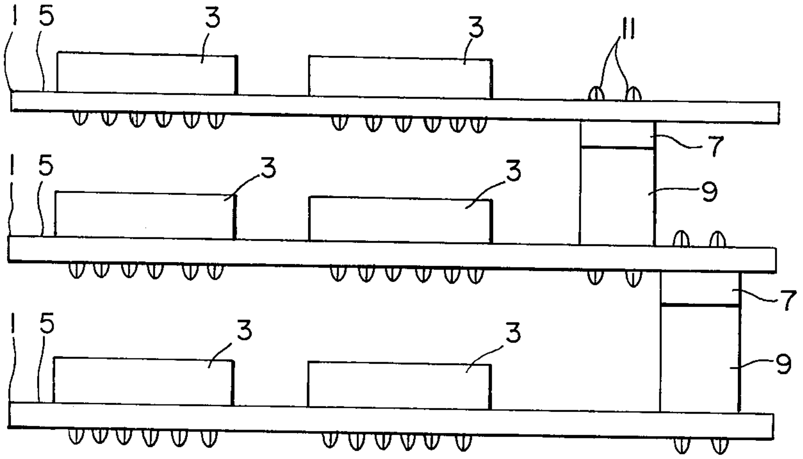
FIG.1. (PRIOR ART)
FIG. 1 is an elevational view of a stack of printed circuit boards interconnected with connectors of the prior art.

FIG. 1 shows stacked printed circuit boards 1 including electronic components 3 mounted on component side 5 of the printed circuit boards. Printed circuit boards 1 are electrically connected through male connectors 7 and female connectors 9.

Due to the height of female connectors 9, the boards 1 are separated a distance considerably greater than the height of components 3. This results in a considerable amount of wasted space when a large number of stacked printed circuit boards are interconnected with prior art connectors.

Additionally, in prior art devices, the terminals of either the male or female connector (in FIG. 1 the terminals 11 of male connector 7) are soldered on the component side 5 of printed circuit boards 1. This requires a two-step soldering process and greatly increases the assembly costs of the printed circuit boards.

Figure 2:
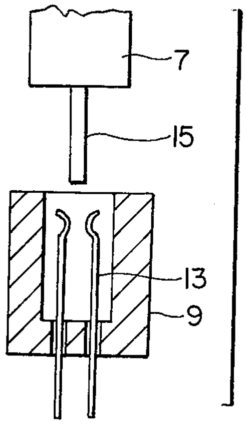
FIG.2. (PRIOR ART)
FIG. 2 is a cross-sectional view of a prior art connector.

FIG. 2 shows a detail of the prior art connector. Female connector 9 includes spring contacts 13 spaced to resiliently engage male contact 15. If the spring contacts 13 are shortened to enable closer spacing of the printed circuit boards, the spring contacts 13 are subjected to bending stresses by the insertion of male contact 15, which can cause permanent deformation of the spring contacts 13, and lead to reduced contact pressure and eventual electrical or mechanical failure of the connectors.

Figure 3:
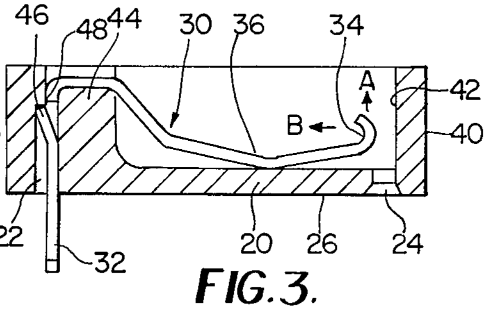
FIG. 3 is a cross-sectional view of the female printed circuit board connector of the present invention.

FIG. 3 shows a female connector according to the present invention, including the connector body or housing 20. The housing 20 includes contact mounting passageway 22 and male contact receiving opening 24 communicating with circuit board mounting surface 26.

Female contact member 30 includes terminal end 32 extending through contact mounting passageway 22, folded back wiping contacting end 34 adjacent contact receiving opening 24, and curved intermediate portion 36 which is substantially parallel to circuit board mounting surface 26. Contact 30 is preferably made of a resilient material such as phosphor bronze, and is bent such that intermediate portion 36 is biased toward surface 26. Therefore, when a male contact is inserted in contact receiving opening 24, contacting end 34 is moved only very slightly in direction a and exerts considerable force against movement in direction b, thus supplying considerable contact pressure and assuring good electrical contact.

Housing 20 may include sidewall 40 having inner surface 42 aligned with the outer wall of contact receiving opening 24. In this way, inner surface 42 acts as a guide for a male contact inserted in opening 24. The space between inner surface 42 and contacting end 34 is selected to provide the desired contact pressure with a given sized male contact.

Contact 30 is held against movement toward surface 26 by upwardly extending support member 44 around which the contact is bent. The bent portion of the contact is substantially U-shaped. Finger-like extension 46 of contact 30 engages stop 48 of housing 20 to hold the contact against movement away from surface 26.

Figure 4:
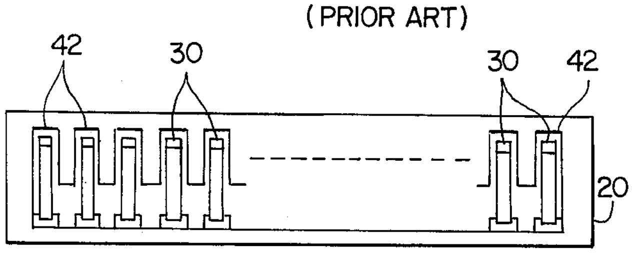
FIG. 4 is a top plan view of a multiconductor connector according to the present invention.
Figure 5:
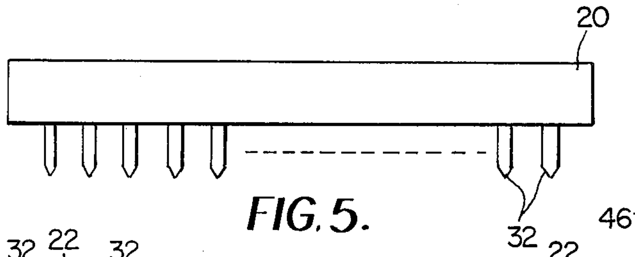
FIG. 5 is a side elevational view of the connection shown in FIG. 4.
Figure 6:
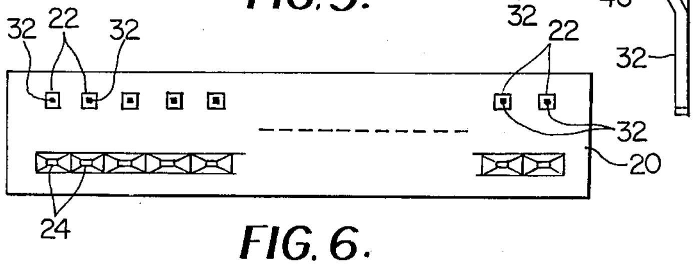
FIG. 6 is a bottom plan view of the connector shown in FIGS. 4 and 5.

FIGS. 4, 5 and 6 show various views of a multiconductor connector consisting of elongated housing 20 having a plurality of contacts 30 therein.

Figure 7:
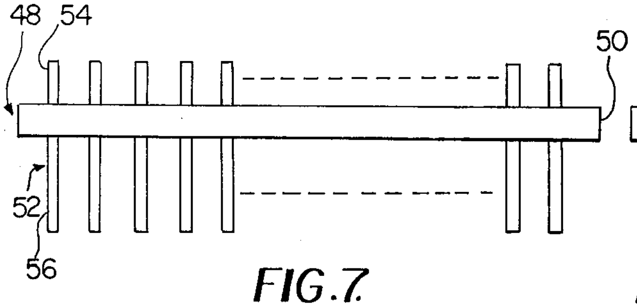
FIGS. 7 and 8 are a side elevational view, and an end elevational view, respectively, of a male connector suitable for use with the connector of the present invention.
Figure 8:
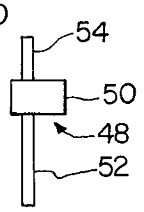

FIGS. 7 and 8 show a multiconductor male connector 48 suitable for use with the above-described female connector. The male connector includes insulator strip 50 and a plurality of male contacts 52 having terminal ends 54 to be connected to a printed circuit board, and contact ends 56 to be inserted in contact receiving opening 24.

Figure 9:
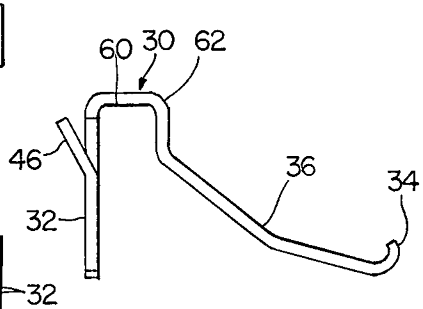
FIGS. 9 and 10 are an enlarged side elevational view and end elevational view, respectively, of the female contact for use in the connector of the present invention.

FIG. 9 shows female contact 30 in its relaxed position. U-shaped portion 60 includes right angle bend 62 which is resiliently flexed upon insertion of the contact into the housing 20 in order to bias intermediate portion 36 toward bottom surface 26.

Figure 10:
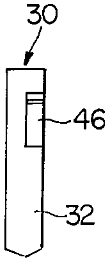

The terminal end 32, including finger-like extension 46, is shown in FIG. 10.

Figure 11:
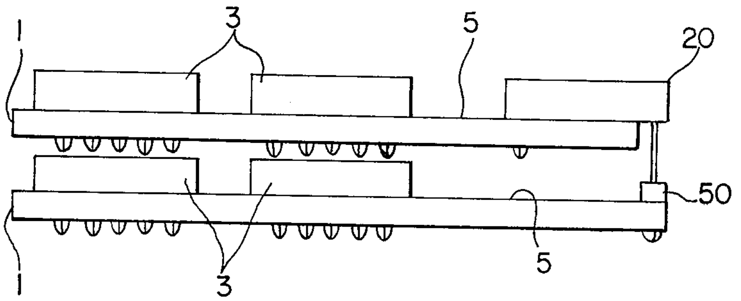
FIGS. 11 and 12 are side elevational views of stacked printed circuit boards connected with connectors according to the present invention.
Figure 12:
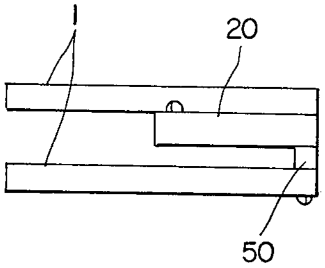

The advantages of the present invention are clear from FIGS. 11 and 12 which show circuit boards 1 having electronic components 3 mounted on component sides 5 thereof. In FIG. 11, both male and female connectors 50 and 20, respectively are mounted on the component side 5 of respective circuit boards 1. This allows the connectors to be soldered to the printed circuit boards at the same time the components are soldered, greatly reducing the expense and complexity of assembling the printed circuit boards. Because female connector 20 is no taller than components 3, a series of boards could be stacked with a considerable savings of space over the stacking allowed by prior art connectors.

FIG. 12 shows an alternate installation of female connector 20 on the bottom or soldering side of circuit board 1, if desired. Additional male connectors 50 could be attached to the component side of the same circuit board allowing for stacking of a number of circuit boards.

Figure 13:
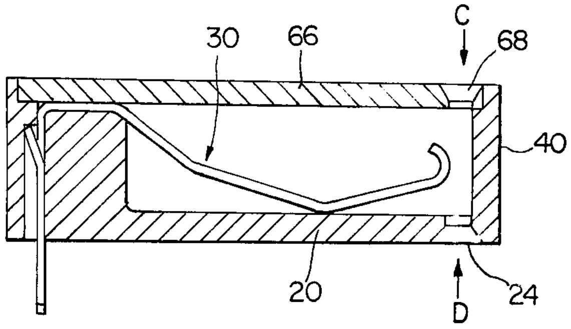
FIG. 13 is a cross-sectional view of an alternate embodiment of the connector of the present invention.

Housing 20 may include top plate 66 having contact receiving opening 68, as shown in FIG. 13. In this way, male contacts may be inserted in the direction of arrow c or arrow d.

Figure 14:
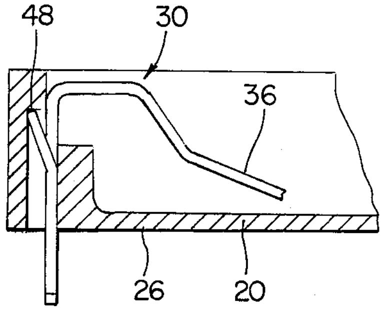
FIG. 14 is a partial cross-sectional view of a further embodiment of the present invention.

Due to the biasing of intermediate portion 36 toward bottom suface 26, support member 44 may be eliminated as shown in FIG. 14.

Figure 15:
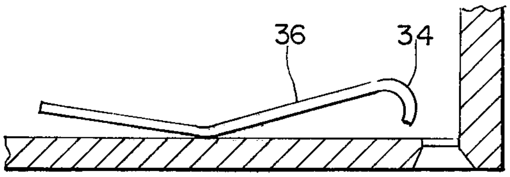
FIG. 15 is a partial cross-sectional view of a still further embodiment of the present invention.

Contacting end 34 may be bent upward as shown in FIG. 3 or it may be bent downward as shown in FIG. 15, depending upon from which direction the male contact is to be inserted.

Figure 16:
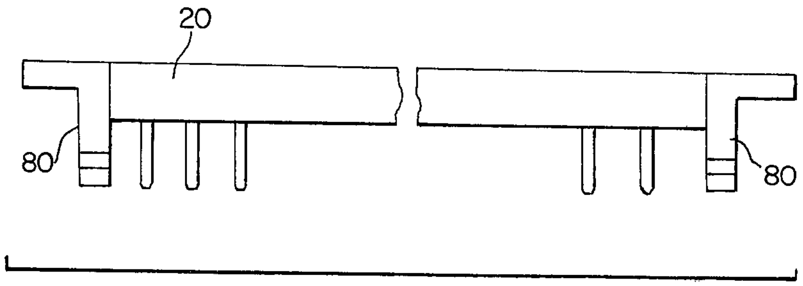
FIGS. 16 and 17 are side and end elevational views, respectively, of a connector according to the present invention having optional alignment means to guide a male connector into proper engagement.
Figure 17:
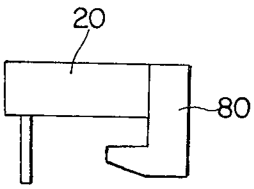

In order to insure that a male connector is properly inserted in the female connector, the connector may include alignment members 80 as shown in FIGS. 16 and 17.

From the foregoing, it can be readily realized that this invention can assume various embodiments. Thus, it is to be understood that the invention is not limited to the specific embodiments described herein, but is to be limited only by the appended claims.

The embodiments of the invention in which an exclusive property or privilege is claimed are defined as follows:

1. An electrical connector for mounting on a printed circuit board, said connector comprising:

a housing having a substantially continuous bottom surface for contacting one side of a printed circuit board, said housing including at least one contact mounting passageway perpendicular to and extending through said bottom surface and said housing further having at least one contact receiving opening spaced from said passageway perpendicular to and extending through said bottom surface, said opening receiving a male contact inserted thereinto through said bottom surface in a direction perependicular to said bottom surface and parallel to said passageway;

at least one resilient conductive female contact having a terminal end extending through said contact mounting passageway, an intermediate curved portion resiliently flexed within said housing against the opposite side of said housing from said bottom surface, said intermediate portion being elongated in a direction generally perpendicularly away from said terminal end and extending substantially parallel to said bottom surface to present a low profile in a direction perpendicular to said bottom surface and thereby reducing the dimensions of the connector in a direction perpendicular to said printed circuit board, and a folded back wiping contacting end adjacent said contact receiving opening for engaging said male contact inserted into said contact receiving opening of said housing generally perpendicular to said intermediate portion, said folded back end protruding at least partially into said contact receiving opening for receiving contact mating forces from said male contact in a direction perpendicular to said contact receiving opening and substantially lengthwise along said resiliently flexed elongated intermediate portion of said female contact; and means for retaining said contact in said housing.

2. The electrical connector as claimed in claim 1, wherein said means for retaining includes a support member extending away said bottom surface, said intermediate portion of said contact including an inverted U-shaped portion bent over said support member.

3. The electrical connector as claimed in claim 2, wherein said means for retaining further includes a stop means formed in said passageway and a finger on said contact for engaging said top means.

4. The electrical connector as claimed in claim 1, wherein said housing includes an end wall perpendicular to said bottom surface, an inner surface of said end wall being aligned with an ouer surface of said contact receiving opening remote from said contact mounting passageway, whereby a male contact inserted in said contact receiving opening will be supported between said inner surface of said wall and said contacting end of said female contact.

5. The electrical connector as claimed in claim 1, wherein said contact receiving opening extends through said bottom surface.

6. The electrical connector as claimed in claim 1, wherein said housing includes a top plate on the opposite side of said intermediate portion from said bottom surface, said top plate including said at least one contact receiving opening therein.

7. The electrical connector as claimed in claim 1, wherein said housing includes a plurality of said female contacts mounted in respective ones of a corresponding plurality of mounting passageways.

8. The electrical connector as claimed in claim 1, wherein said housing includes alignment means for guiding a male connector into engagement therewith.

9. The electrical connector as claimed in claim 1, in combination with a male connector comprising at least one elongated male contact adapted to extend through said contact receiving opening and slidably engage said contacting end of said female contact.

10. The combination as claimed in claim 9, wherein said male contact axially moves said female contact, whereby the resiliency of said female contact causes said female contact to press against said male contact.

* * * * *